United States Patent
Miyahara et al.

(10) Patent No.: US 9,863,060 B2
(45) Date of Patent: Jan. 9, 2018

(54) METHOD FOR MANUFACTURING SINGLE CRYSTAL

(71) Applicant: SHIN-ETSU HANDOTAI CO., LTD., Tokyo (JP)

(72) Inventors: Yuuichi Miyahara, Echizen (JP); Shou Takashima, Sabae (JP); Yasuhiko Sawazaki, Minami-echizen-cho (JP); Atsushi Iwasaki, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 65 days.

(21) Appl. No.: 15/036,095

(22) PCT Filed: Nov. 12, 2014

(86) PCT No.: PCT/JP2014/005672
§ 371 (c)(1),
(2) Date: May 12, 2016

(87) PCT Pub. No.: WO2015/083323
PCT Pub. Date: Jun. 11, 2015

(65) Prior Publication Data
US 2016/0289861 A1 Oct. 6, 2016

(30) Foreign Application Priority Data
Dec. 6, 2013 (JP) ................. 2013-252747

(51) Int. Cl.
*C30B 15/10* (2006.01)
*C30B 29/06* (2006.01)
(Continued)

(52) U.S. Cl.
CPC ............... *C30B 15/10* (2013.01); *C03C 3/04* (2013.01); *C30B 15/30* (2013.01); *C30B 29/06* (2013.01);
(Continued)

(58) Field of Classification Search
CPC combination set(s) only.
See application file for complete search history.

(56) References Cited

U.S. PATENT DOCUMENTS

| 6,225,245 B1 * | 5/2001 | Utsunomiya ........... C03B 19/09 423/338 |
| 2010/0162947 A1 | 7/2010 | Harada et al. |
| 2011/0017125 A1 | 1/2011 | Sugawara et al. |

FOREIGN PATENT DOCUMENTS

| CN | 102007234 A | 4/2011 |
| CN | 202254799 U | 5/2012 |

(Continued)

OTHER PUBLICATIONS

Feb. 17, 2015 Search Report issued in International Patent Application No. PCT/JP2014/005672.
(Continued)

*Primary Examiner* — Duy Deo
*Assistant Examiner* — Erin Bergner
(74) *Attorney, Agent, or Firm* — Oliff PLC

(57) ABSTRACT

Method for manufacturing a single crystal according to a CZ method, including: pre-examining a correlation between an Al/Li ratio in a quartz raw material powder used for producing the quartz crucible, a use time of the crucible, a devitrification ratio at the use time, and occurrence or nonoccurrence of melt leakage attributable to the devitrification part; setting a range of the devitrification ratio of the quartz crucible in order not to generate the melt leakage, and determining a maximum use time of the quartz crucible according to the Al/Li ratio so as to fall within the set range of the ratio, on the basis of the correlation; and growing the single crystal by using the quartz crucible in the range of the maximum use time. This provides a manufacturing method (Continued)

which can efficiently use a quartz crucible to grow a single crystal while preventing occurrence of melt leakage.

4 Claims, 2 Drawing Sheets

(51) Int. Cl.
    *C03C 3/04*         (2006.01)
    *C30B 15/30*      (2006.01)
    *C30B 30/04*      (2006.01)

(52) U.S. Cl.
    CPC .......... *C30B 30/04* (2013.01); *C03C 2201/30* (2013.01); *C03C 2201/32* (2013.01)

(56) References Cited

FOREIGN PATENT DOCUMENTS

| | | |
|---|---|---|
| JP | H05-58788 A | 3/1993 |
| JP | H07330483 A | 12/1995 |
| JP | 2006016240 A | 1/2006 |
| JP | 2006-036568 A | 2/2006 |
| JP | 2010155760 A | 7/2010 |
| JP | 2014005154 A | 1/2014 |

OTHER PUBLICATIONS

Sep. 21, 2017 Search Report in Chinese Application No. 2014800658777.

\* cited by examiner

METHOD FOR MANUFACTURING SINGLE CRYSTAL

TECHNICAL FIELD

The present invention relates to a method for manufacturing a single crystal to grow a single crystal from a raw melt contained in a quartz crucible used in a Czochralski method (CZ method).

BACKGROUND ART

Various methods are known as a method for manufacturing a single crystal such as a silicon single crystal used for a semiconductor substrate. Among them, the CZ method is widely adopted as a rotation pulling method. Furthermore, a magnetic field applied Czochralski method (MCZ method) is widely known, in which a silicon single crystal is pulled by the CZ method while applying a magnetic field in order to reduce the oxygen concentration of a silicon single crystal or to manufacture a large diameter crystal with ease.

The apparatus for manufacturing a single crystal such as a silicon single crystal by these CZ methods contains a main chamber (furnace) and a pull chamber connected thereto. In the main chamber, a quartz crucible is installed with its outside held by a graphite crucible. A heater is installed around these crucibles, and a raw material (polycrystalline silicon) in the quartz crucible is melted by the heater.

A seed crystal hung by a wire from the upward is brought to contact with this raw melt (silicon melt), and then the seed crystal is pulled to grow a single crystal (see Patent Document 1, for example).

CITATION LIST

Patent Literature

Patent Document 1: Japanese Unexamined Patent publication (Kokai) No. H05-058788

SUMMARY OF INVENTION

Problem to be Solved by the Invention

Herein, the quartz crucible is exposed to high temperature during the aforementioned growing step of a silicon single crystal with the heat from the heater transferred via the graphite crucible. Accordingly, although the quartz crucible is made from quartz glass, the quartz glass is crystallized from the outer surface side contacting to the graphite crucible with high temperature. The crystallization proceeds to the inner surface side of the quartz crucible with a passage of time exposed to high temperature.

When the quartz crucible is taken out and cooled after growth of a silicon single crystal, the crystallized part got to contain innumerable microscopic cracks due to thermal shrinkage of the quartz to form a devitrified state which is white and opaque. Accordingly, the foregoing crystallization of a quartz glass will be referred to as "devitrification" in the following.

Since devitrified-state quartz has a small elastic coefficient compared to vitrified-state quartz, when the devitrification proceeds from the outer surface side to the inner surface side of the quartz crucible, the elasticity of the quartz crucible gets smaller, and thereby the quartz crucible tends to contain cracks by thermal expansion or thermal shrinkage due to temperature change or an impact during a growing step of a silicon single crystal.

When the quartz crucible get cracked during growing a silicon single crystal, there arises melt leakage, in which the silicon melt in the quartz crucible leaks out of the quartz crucible, and the growth of a silicon single crystal cannot be continued. Moreover, if the silicon melt leaked out of the quartz crucible contacts to hot zone parts in the apparatus such as a graphite crucible and so on, these parts are damaged and difficult to use continuously, and have to be replaced thereby.

Accordingly, melt leakage involves a problem to rise the manufacturing cost of a silicon single crystal considerably.

To solve this problem, the time for growing step of a silicon single crystal (hereinafter, simply referred as "operation time") is generally reduced. However, the devitrification of each quartz crucible proceeds in a various rate, and accordingly the operation time has to be defined to adjust to the quartz crucible with most rapid devitrification rate in the previous results in order to prevent melt leakage.

As a result, in a quartz crucible with slow devitrification rate, the growth of a silicon single crystal is obliged to stop even if the devitrification is not proceeded to the thickness liable to generate melt leakage, which is really inefficient.

The present invention was accomplished in view of the above-described problems. It is an object of the present invention to provide a manufacturing method which can grow a single crystal by efficiently using a quartz crucible with preventing melt leakage.

Means for Solving Problem

To solve the problems, the present invention provides a method for manufacturing a single crystal from a raw melt contained in a quartz crucible located in a furnace of a single crystal manufacturing apparatus according to a Czochralski method, comprising: examining a correlation between a concentration ratio of Al to Li contained in a quartz raw material powder used for producing the quartz crucible, a use time of the quartz crucible, a ratio of a thickness of a devitrification part to a thickness of the quartz crucible at the use time, and occurrence or nonoccurrence of melt leakage attributable to the devitrification part, in advance; setting a range of the ratio of the thickness of the devitrification part to the thickness of the quartz crucible to be used in growing the single crystal in order not to generate the melt leakage attributable to the devitrification part, and determining a maximum use time of the quartz crucible according to the concentration ratio of Al to Li contained in the quartz raw material powder used for producing the quartz crucible to be used so as to fall within the set range of the ratio, on the basis of the correlation; and growing the single crystal by using the quartz crucible in the range of the maximum use time.

The present inventors have diligently investigated and found that the devitrification rates of quartz crucibles differ with each other by the foregoing concentration ratio of Al to Li (hereinafter, simply referred to as "Al/Li ratio"). That is, the Al/Li ratio brings about the difference in the use time till the melt leakage attributable to the devitrification part of the quartz crucible occurs.

Accordingly, the inventive manufacturing method such as the foregoing can prevent an occurrence of melt leakage, and further, can determine the use time of a quartz crucible according to the difference of the devitrification rate. In the present invention, it is possible to continue to use a quartz crucible which has been previously stopped to use in spite of it is still usable, being adjusted to the shortest use time, and to grow single crystals till the longest time to prevent excess devitrification, for example. Since a quartz crucible can be efficiently used as described above, operation time to grow single crystals can be extended. Therefore, the yield of single crystals per a quartz crucible can be increased, and the cost of a single crystal can be reduced.

In this case, the range of the ratio of the thickness of the devitrification part to the thickness of the quartz crucible can be 80% or less, the range being set in order not to generate the melt leakage attributable to the devitrification part.

When the ratio of the thickness of the devitrification part to the thickness of the quartz crucible to be set (hereinafter, simply referred to as "devitrification ratio") is set to 80% or less, an occurrence of a crack in the quartz crucible attributable to the devitrification part to generate melt leakage can be prevented more securely.

The single crystal to be grown can be a silicon single crystal.

It is very effective to use a quartz crucible efficiently as described above to reduce the cost of a CZ silicon single crystal, since the CZ method is widely used in growing a silicon single crystal.

Effect of Invention

As described above, the present invention can reduce the risk of melt leakage and can use a quartz crucible more efficiently by extending the maximum use time. Accordingly, it is possible to extend the maximum operation time of a single crystal growing step, and to reduce the cost of a single crystal thereby.

DESCRIPTION OF EMBODIMENTS

The present invention will be explained specifically as an embodiment with reference to the figures in the following, but the present invention is not limited thereto.

Figure 3:
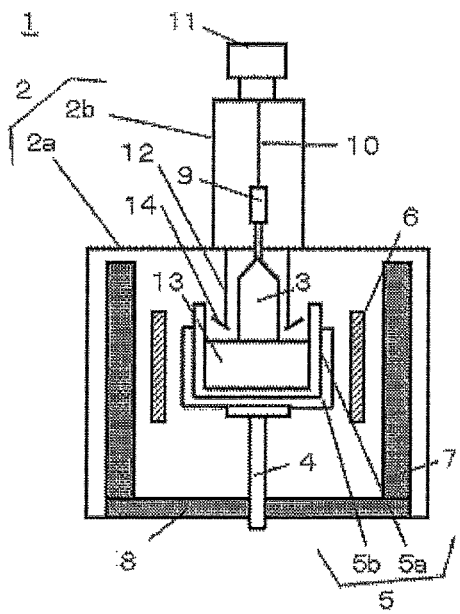
FIG. 3 is a schematic drawing to show an example of a sectional structure of a CZ single crystal manufacturing apparatus usable for the manufacturing method of a silicon single crystal of the present invention.

FIG. 3 shows a schematic drawing of an example of a sectional structure of a CZ single crystal manufacturing apparatus usable for the manufacturing method of a silicon single crystal of the present invention.

The CZ single crystal manufacturing apparatus 1 is comprised of a hollow cylindrical chamber 2 as the exterior. The chamber 2 is comprised of a main chamber (furnace) 2a forming the lower cylinder, and a pull chamber 2b forming the upper cylinder connected and fixed to the main chamber 2a.

The main chamber 2a contains a hot zone to melt a raw material (herein, silicon raw material) and to grow a silicon single crystal 3. The central part of the main chamber 2a is provided with a crucible 5 composed of doubled structure of a quartz crucible 5a to mount the raw material and a graphite crucible 5b to support the outside of the quartz crucible 5a on a support axis 4 which can move vertically and rotationally. Around the crucible 5, a resistance heater 6 is installed concentrically. Around the heater 6, a heat insulating cylinder 7 is installed concentrically, and a heat insulating board 8 is installed underneath the heater 6 and on the bottom of the apparatus.

Above the foregoing hot zone, a pulling axis (wire) 10, which can move vertically and rotationally and holds a seed crystal 9 to pull the silicon single crystal 3, is installed. The pulling axis 10 is provided with a pulling-axis elevator 11, which is rotatable and has a connection with the pull chamber 2b.

A cylindrical purge tube 12 is installed above the surface of a silicon melt 13 so as to surround the silicon single crystal 3 in the middle of the pulling. The purge tube 12 is installed so as to extend from the ceiling of the main chamber 2a toward the silicon melt surface. The purge tube 12 is provided with the ring-formed collar 14 on the silicon melt surface side.

It is also possible to install an apparatus for applying a magnetic field (such as an electromagnet) to the outside of the furnace to form an apparatus for a MCZ method to grow the silicon single crystal 3 while applying a magnetic field to the silicon melt 13, as the need arises.

Figure 1:
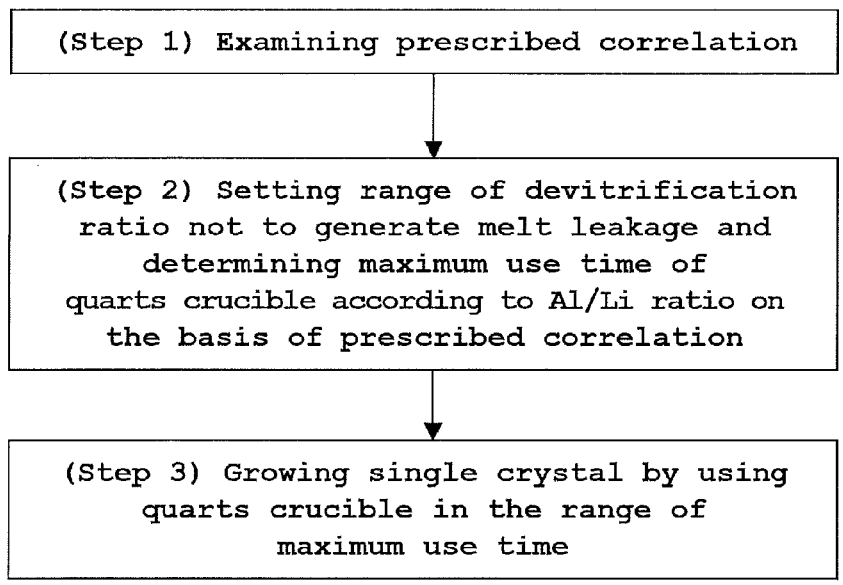
FIG. 1 is a flow chart to show an example of the method for manufacturing a silicon single crystal of the present invention.

FIG. 1 shows an example of the method for manufacturing a silicon single crystal of the present invention using the CZ single crystal manufacturing apparatus of FIG. 3.

Herein, the growth of a silicon single crystal is explained. This invention can be effectively applied since manufacturing of a silicon single crystal by a CZ method is generally performed. The present invention is not limited thereto, and is applicable to manufacture a compound semiconductor and others; which may be any single crystal which can be grown by using a quartz crucible according to the CZ method.

As shown in FIG. 1, the inventive manufacturing method is generally composed of a step to examine a prescribed correlation (Step 1); a step to set a range of the devitrification ratio not to generate melt leakage, and to determine a maximum use time of the quartz crucible according to the Al/Li ratio, on the basis of the prescribed correlation (Step 2); and a step to grow a single crystal by using the quartz crucible in the range of the maximum use time (Step 3).

Hereinafter, each step will be specified.
(Step 1: Examining Prescribed Correlation)

First, the prescribed correlation is examined. This prescribed correlation means a correlation between a concentration ratio of Al to Li contained in a quartz raw material powder used for producing the quartz crucible (Al/Li ratio), a use time of the quartz crucible, a ratio of a thickness of a devitrification part to a thickness of the quartz crucible at the use time (devitrification ratio), and occurrence or nonoccurrence of melt leakage attributable to the devitrification part.

Herein, the significance to examine this correlation will be explained.

The quartz crucible in the middle of a growing step of a silicon single crystal is continuously exposed to high temperature of 1420° C. or more from the outer surface of a graphite crucible side by the heater such that the filled silicon melt is not re-solidified. As described above, when a quartz crucible is continuously exposed to high temperature, the devitrification of the quartz crucible starts from the outer surface side of the quartz crucible and proceeds to the inner surface side of the quartz crucible.

This devitrification part has a small elastic coefficient compared to vitrified-state quartz. Accordingly, when the devitrification ratio gets larger, the elasticity of the quartz crucible gets smaller, which brings lowering of durability to an impact by a contact with silicon raw material during re-filling of silicon raw material when the single crystals are grown by multi-pulling, and to thermal expansion due to a temperature raise during an operation or thermal shrinkage due to a temperature fall.

Accordingly, when the devitrification ratio gets larger, the quartz crucible tends to generate a crack during an operation, which increases a possibility for a silicon melt in the quartz crucible to leak out.

As described above, the timings of increasing the devitrification ratio to generate melt leakage in the quartz crucibles vary and differ from each other. Accordingly, as described above, in the previous methods, an operation time have to be defined to be adjusted to the quartz crucible with most rapid devitrification rate on the basis of previous results to estimate the security.

The present inventors, however, have found that the foregoing Al/Li ratio relates to the devitrification rate. The devitrification rate is slower when the Al/Li ratio is smaller, and the devitrification rate is faster when the Al/Li ratio is larger.

If the correlation is pre-examined, it is possible to grasp a timing of occurrence of melt leakage according to the Al/Li ratio (i.e., according to the quartz crucible), and the devitrification ratio at that time. In other words, it is possible to evaluate a limit of a use time of a quartz crucible so as not to generate melt leakage. Accordingly, it comes to be possible to use a quartz crucible until the maximum time which can prevent excess devitrification to continue to grow single crystals. That is, it is possible to use a quartz crucible efficiently, to increase a yield of a single crystal per a quartz crucible to reduce the cost of a single crystal, and to prevent occurrence of melt leakage.

Generally, a quartz crucible is produced by placing quartz raw material powder into a mold and discharge melting to vitrify. Since there is not a step to be contaminated with Al or Li, the concentration of Al and Li in the quartz raw material powder can be regarded as a concentration of Al and Li in the quartz crucible as it is. Accordingly, the Al/Li ratio can be evaluated on the basis of concentrations of Al and Li contained in the quartz raw material powder to be used for producing the quartz crucible, which concentrations are previously measured.

The foregoing correlation is examined under such significance, but the specific method is not particularly limited. For example, it is possible to evaluate on the basis of previous data obtained when growing a single crystal in the past.

Alternatively, the foregoing correlation can be examined by preparing plural of quartz crucibles with different Al/Li ratios to grow single crystals actually by using each quartz crucible, and examining a use time of the quartz crucible, a devitrification ratio corresponding to the use time, and occurrence or nonoccurrence of melt leakage attributable to the devitrification part of each quartz crucible as a pre-examination.

Figure 2:
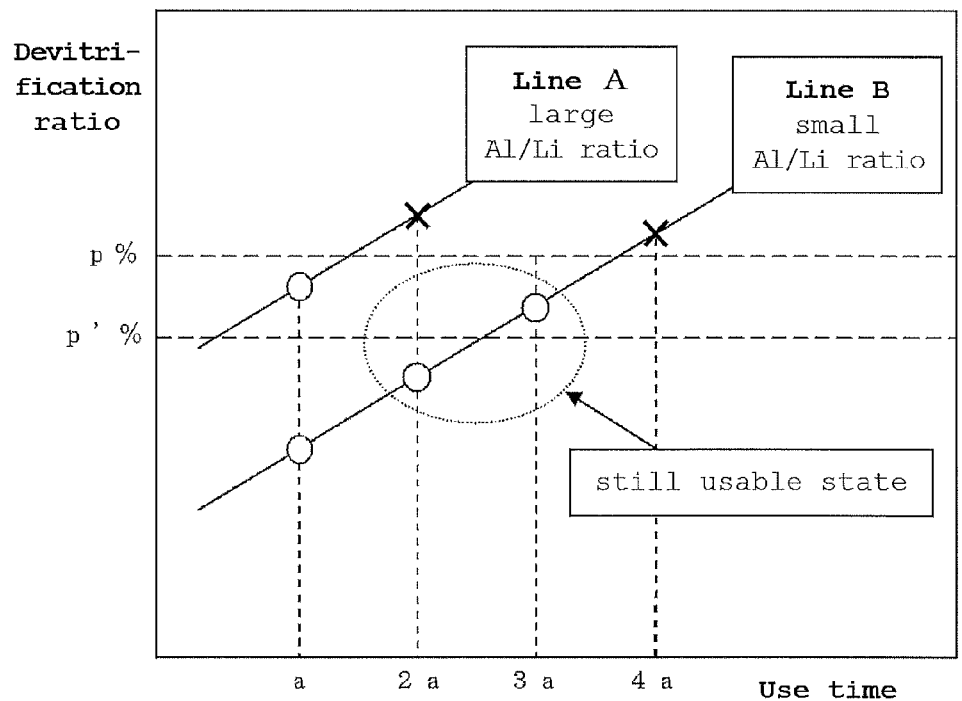
FIG. 2 is a graph to show an example of a correlation between an Al/Li ratio, a use time of the quartz crucible, a devitrification ratio, and occurrence or nonoccurrence of melt leakage.

FIG. 2 shows an example of the pre-examined correlation.

In FIG. 2, the ordinate is a devitrification ratio and the abscissa is a use time of the quartz crucible. This shows results of pre-examinations as described above by using two quartz crucibles with different Al/Li ratios; Line A indicates results of larger Al/Li ratio, and Line B indicates results of smaller Al/Li ratio; and "○" in FIG. 2 indicates nonoccurrence of melt leakage, "x" indicates occurrence of melt leakage.

As shown in FIG. 2, in the quartz crucible of Line A, melt leakage occurred at a time of "$2a$". On the other hand, in the quartz crucible of Line B, melt leakage still did not occur at a time of "$2a$" to "$3a$", and occurred melt leakage at a time of "$4a$".

It also shows that melt leakage occurred when the devitrification ratio had exceeded "p %" in both quartz crucibles.

(Step 2: Setting Range of Devitrification Ratio not to Generate Melt Leakage and Determining Maximum Use Time of Quartz Crucible According to Al/Li Ratio on the Basis of Prescribed Correlation)

On the basis of a correlation as in FIG. 2, the range of the devitrification ratio not to generate melt leakage is set, and the maximum use time of a quartz crucible is determined according to the Al/Li ratio.

First, in a quartz crucible to be actually used in a subsequent growing step of a single crystal, the range of the devitrification ratio in order not to generate melt leakage is set. For example, in a use of a quartz crucible with a similar Al/Li ratio to that of the one represented by Line B, the range of the devitrification ratio can be set to "p'%" or less. More preferably, the range can be set to the maximum devitrification ratio immediately before occurring melt leak or less, that is, "p %" or less in order to use the quartz crucible more efficiently.

Then, after setting the range to "p %" or less, for example, the maximum use time of the quartz crucible is determined according to the Al/Li ratio of the quartz crucible to be used (herein, similar to the one represented by Line B) so as to fall within the range. Herein, for example, that can be determined to a time of "$2a$" to "$3a$". If the range is set to the maximum time in the previously set range of the devitrification ratio, the quartz crucible can be used more efficiently.

Incidentally, such determination according to the Al/Li ratio has not been performed in the previous methods. The maximum use time has been determined to a time of "$a$" even when using a quartz crucible with a similar Al/Li ratio to that of the one represented by Line B, only because the devitrification excessively proceeded to occur melt leakage at a time of "$2a$" in some cases.

In the present invention, however, this Step 2 is performed after examining the correlation in Step 1, and accordingly, when using a quartz crucible with a similar Al/Li ratio to that of the one represented by Line B, it is possible to determine to use the quartz crucible for longer time than in the previous methods. That is, it is possible to use a quartz crucible more efficiently and to spend longer time to grow a single crystal in this case, and it is possible to pull much more single crystals thereby.

As described above, in setting the range of the devitrification ratio not to generate melt leakage, the range can be determined at each times, however, it can be set to 80% or less, for example. Considering previous data, if the range is 80% or less, occurrence of melt leakage attributable to the devitrification part can be prevented more securely. Moreover, relatively sufficient time can be obtained in a range in which melt leakage can be prevented.

(Step 3: Growing Single Crystal by Using Quartz Crucible in the Range of Maximum Use Time)

Then, a single crystal is grown in a range of the maximum use time of the quartz crucible determined as described above. Regarding a yield of the single crystal, it is naturally preferable to grow for the maximum use time. The single crystal growing process itself can be similar to the previous methods.

Hereinafter shows an example to use a manufacturing apparatus 1 of FIG. 3.

First, silicon raw material introduced to the quartz crucible 5*a*, which use time has been already determined, is melted by the heater 6 installed around the crucible 5. Then, to the surface of the formed silicon melt 13, the seed crystal 9 held at the lower end of the pulling axis 10 is immersed. The pulling axis 10 is pulled upward while the crucible 5 and the pulling axis 10 are rotated to grow the silicon single crystal 3 on the lower end face of the seed crystal 9.

In growing this silicon single crystal 3, the crystal growing on the lower end face of the seed crystal 9 is narrowed to a diameter of approximately 3 to 8 mm, which is a necking process in order to annihilate slip dislocations originally contained in the seed crystal 9 and slip dislocations introduced due to thermal shock when the seed crystal 9 was brought into contact with the silicon melt 13. Then a cone portion to form a straight body (constant diameter portion) with a prescribed diameter is formed, and subsequently the silicon single crystal 3 is grown in the prescribed diameter. When the silicon single crystal 3 reaches to the aimed length, tail narrowing of the end portion is performed to finish the growth of the silicon single crystal 3.

It is possible to perform multi-pulling, in which silicon raw material is additionally incorporated to grow a silicon single crystal additionally, as the need arises. This growth of the silicon single crystal is finished within the maximum use time of the quartz crucible.

As described above, in the present invention, it is possible to grow single crystals without proceeding excess devitrification and occurrence of melt leakage within the range of the maximum use time determined in Step 2. Furthermore, it is possible to use a quartz crucible quite efficiently since the maximum use time is determined in consideration of the difference of the Al/Li ratios, that is, the difference of the devitrification rate of each quartz crucible. Accordingly, it is possible to replace quartz crucibles less frequently than in the previous method, to increase the yield of a single crystal per a quartz crucible, and to reduce the cost of a single crystal thereby.

EXAMPLE

The present invention will be more specifically described below with reference to Example and Comparative Example, but the present invention is not limited thereto.

Example

Using a CZ single crystal manufacturing apparatus shown in FIG. 3, silicon single crystals were grown by using quartz crucibles made from quartz powders in which Al/Li ratios are different from each other such as 5, 6, 7, and 8 in molar ratios, having an inner diameter of 800 mm each. In this case, the prescribed correlations were examined at first as in Step 1 of the present invention in FIG. 1.

Using each quartz crucible, a silicon single crystal with a diameter of 300 mm was pulled for each use time (use time indexes: 0.9, 1.1, 1.2, 1.3, and 1.4 times) based on the use time of previous method (use time index: 1.0 times) in Comparative Example described below. On each quartz crucible after the operation, measurement was performed at a part where the ratio of a thickness of the devitrification to the thickness of the quartz crucible was maximum; occurrence or nonoccurrence of melt leakage was also examined.

The same investigations were also performed in cases in which each use time index is 1.0 times as previous one.

Figure 4:
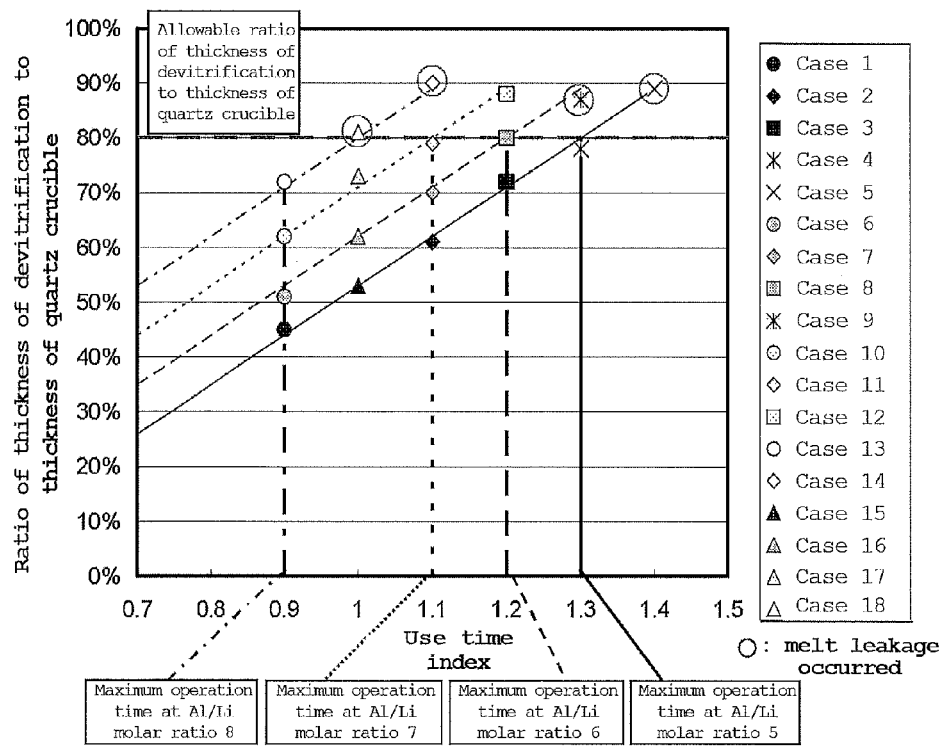
FIG. 4 is a graph to show a correlation between the Al/Li ratio, the use time of the quartz crucible, the devitrification ratio, and the occurrence or nonoccurrence of melt leakage which are obtained by the Example.

These results (correlations) are summarized in Table 1 and FIG. 4 (cases 1 to 18). In FIG. 4, the points surrounded by "○" are cases in which melt leakage occurred.

TABLE 1

|  | Al/Li ratio of raw material quartz powder used for quartz crucible | Use time index | Devitrification ratio | Occurrence of melt leakage |
| --- | --- | --- | --- | --- |
| Case 1 | 5 | 0.9 | 45% | Non |
| Case 2 | 5 | 1.1 | 61% | Non |
| Case 3 | 5 | 1.2 | 72% | Non |
| Case 4 | 5 | 1.3 | 78% | Non |
| Case 5 | 5 | 1.4 | 89% | Occurred |
| Case 6 | 6 | 0.9 | 51% | Non |
| Case 7 | 6 | 1.1 | 70% | Non |
| Case 8 | 6 | 1.2 | 80% | Non |
| Case 9 | 6 | 1.3 | 87% | Occurred |
| Case 10 | 7 | 0.9 | 62% | Non |
| Case 11 | 7 | 1.1 | 79% | Non |
| Case 12 | 7 | 1.2 | 88% | Non |
| Case 13 | 8 | 0.9 | 72% | Non |
| Case 14 | 8 | 1.1 | 90% | Occurred |
| Case 15 | 5 | 1.0 | 53% | Non |
| Case 16 | 6 | 1.0 | 62% | Non |
| Case 17 | 7 | 1.0 | 73% | Non |
| Case 18 | 8 | 1.0 | 81% | Occurred |

The cases in which the use time indexes are 0.9, 1.1, 1.2, 1.3, and 1.4 times will be explained in the first place.

They will be explained on each Al/Li ratio. First, as for quartz crucibles using quartz powder with the Al/Li ratio of 5 as raw material (cases 1 to 5), the devitrification ratios were 80% or less, and melt leakage did not occur in Case 1 to Case 4. In Case 5, however, the devitrification ratio was 89%, and melt leakage occurred.

As for quartz crucibles using quartz powder with the Al/Li ratio of 6 as raw material (cases 6 to 9), the devitrification ratios were 80% or less, and melt leakage did not occur in Case 6 to Case 8. In Case 9, however, the devitrification ratio was 87%, and melt leakage occurred.

As for quartz crucibles using quartz powder with the Al/Li ratio of 7 as raw material (cases 10 to 12), the devitrification ratios were 80% or less, and melt leakage did not occur in Case 10 to Case 11. In Case 12, however, the devitrification ratio was 88%. In this Case 12, melt leakage did not occur.

As for quartz crucibles using quartz powder with the Al/Li ratio of 8 as raw material (cases 13 to 14), the ratio of the thickness of the devitrification was 80% or less, and melt leakage did not occur in Case 13. In Case 14, however, the ratio of the thickness of the devitrification to the thickness of the quartz crucible was 90%, and melt leakage occurred.

The cases in which each use time index is 1.0 times will be explained.

In quartz crucibles using quartz powders in which the Al/Li ratios are 5, 6, and 7 as raw material (cases 15 to 17), the devitrification ratios were 80% or less, and melt leakage did not occur.

In a quartz crucible using quartz powder with the Al/Li ratio of 8 as raw material (Case 18), however, the devitrification ratio was 81%, and melt leakage occurred.

Then, the range of the devitrification ratio not to generate the melt leakage attributable to the devitrification part was set to 80% or less on the basis of these results of Case 1 to Case 18, as Step 2 in FIG. 1.

Each maximum use time was determined according to the Al/Li ratio of the quartz crucible to be used in post-steps such that the devitrification ratio falls within this range of 80% or less. That is, single crystals were grown in the post-step by using quartz crucibles in which quartz powders with the Al/Li ratios of 5, 6, 7, and 8 were used as raw material, and maximum use times were determined to 1.3, 1.2, 1.1, and 0.9 times in a use time index, respectively.

Then, silicon single crystals were grown by using each quartz crucible within a range of the maximum use time determined in the foregoing, as Step 3 in FIG. 1.

As a result, when using the quartz crucibles with the Al/Li ratios of 5, 6, and 7, melt leakage did not occur during the growing step of single crystals. Moreover, the use times of quartz crucibles could be extended to 1.3, 1.2, and 1.1 times compared to Comparative Example of previous method, respectively, and more silicon single crystals could be grown.

In case of the quartz crucible with the Al/Li ratio of 8, melt leakage did not occur. Although the use time was 0.9 times, it could be fully used within the range of the use time which would not occur melt leakage.

As for the quartz crucible with the Al/Li ratio of 8 in Comparative Example, although the use time was 1.0 times, melt leakage occurred, and other parts were damaged thereby. There arose a need to replace the parts, and resulted in a single crystal with high cost in total. The Example, in which the use of the crucible was stopped before occurrence of melt leakage, is considered to be efficient compared to such Comparative Example.

Comparative Example

In each prepared quartz crucible (Al/Li ratios of 5, 6, 7, and 8), silicon single crystal was simply grown by setting the use time to be 1.0 times in a use time index on the basis of previous results without examining a correlation as in Table 1 or FIG. 4, unlike Example of the present invention.

The obtained results were same with the cases 15 to 18 in Table 1 and FIG. 4.

That is, melt leakage did not occur in cases of quartz crucibles with the Al/Li ratios of 5 to 7. However, these quartz crucibles were still in a state being sufficiently usable after they were used, in which the devitrification were not proceeded as to generate melt leakage. This is also shown by the correlation in Table 1 and FIG. 4, and accordingly is inefficient regarding the use of quartz crucibles.

In case of the Al/Li ratio of 8, melt leakage occurred. Although the crucible was used for longer time compared to Example, melt leakage occurred, and a cost of the single crystal got high in total.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a single crystal from a raw melt contained in a quartz crucible located in a furnace of a single crystal manufacturing apparatus according to a Czochralski method, comprising:

examining a correlation between a concentration ratio of Al to Li contained in a quartz raw material powder used for producing the quartz crucible, a use time of the quartz crucible, a ratio of a thickness of a devitrification part to a thickness of the quartz crucible at the use time, and occurrence or nonoccurrence of melt leakage attributable to the devitrification part, in advance;

setting a range of the ratio of the thickness of the devitrification part to the thickness of the quartz crucible to be used in growing the single crystal in order not to generate the melt leakage attributable to the devitrification part, and determining a maximum use time of the quartz crucible according to the concentration ratio of Al to Li contained in the quartz raw material powder used for producing the quartz crucible to be used so as to fall within the set range of the ratio, on the basis of the correlation; and growing the single crystal by using the quartz crucible in the range of the maximum use time.

2. The method for manufacturing a silicon single crystal according to claim 1, wherein the range of the ratio of the thickness of the devitrification part to the thickness of the quartz crucible is 80% or less, the range being set in order not to generate the melt leakage attributable to the devitrification part.

3. The method for manufacturing a silicon single crystal according to claim 1, wherein the single crystal to be grown is a silicon single crystal.

4. The method for manufacturing a silicon single crystal according to claim 2, wherein the single crystal to be grown is a silicon single crystal.

* * * * *